Jan. 26, 1971 H. KELLER 3,559,000

VARACTOR DIODE

Filed May 10, 1968 3 Sheets-Sheet 1

INVENTOR
HANS KELLER
BY Philip M. Bolton
ATTORNEY

INVENTOR
HANS KELLER
BY Philip M. Bolton
ATTORNEY

INVENTOR
HANS KELLER
BY Philip M. Bolton
ATTORNEY

United States Patent Office 3,559,000

Patented Jan. 26, 1971

3,559,000
VARACTOR DIODE

Hans Keller, Freiburg, Germany, assignor to International Standard Electric Corporation, New York, N.Y., a corporation of Delaware Filed May 10, 1968, Ser. No. 728,145
Claims priority, application Germany, May 23, 1967, D 53,145
Int. Cl. H01l 1/14
U.S. Cl. 317—234 11 Claims

ABSTRACT OF THE DISCLOSURE

This is an invention of a varactor diode having two lead in conductors which have different geometrical shapes. These lead in conductors determine the inductance of device and hence the resonant frequency. Thus by actually shifting the diode with respect to the conductors the resonant frequency may be varied.

BACKGROUND OF THE INVENTION

Figure 1:
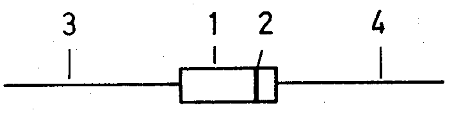

This invention relates to varactor diodes or capacity diodes which are semiconductor devices whose junction capacitance can be varied by the application of a variable DC voltage and which are used in many cases of practical application as a substitute for variable capacitors.

Varactor diodes are manufactured in such a way that in accordance with the planar technique wherein a plurality of varactor diodes are simultaneously manfactured on a semiconductor plate in the course of several steps of operation. Subsequently thereto, the plate is divided into single varactor diodes by way of scratching and breaking, or the like. These finished single varactor diodes are then still provided with a casing and with lead-in conductors.

The varactor diodes resulting from one production charge, vary with respect to their capacitance values, so that a collection of varactor diodes readily provided with casing and lead-in conductor, vary with respect to the junction capacitance. The junction capacitance which varies from sample to sample requires a spreading between units as regards to the resonant frequency of the diode, which is determined by the inductance of the lead-in conductors and by the junction capacitance.

In many cases of practical application it is desirable to obtain a predetermined resonant frequency. Therefore, the manufacturer is required to supply varactor diodes which, in spite of the varying junction capacitance, have narrow tolerances in the sense referred to above. In particular, and with respect to certain cases of practical application, it is demanded that all varactor diodes of one type have the predetermined resonant frequency at an equal total or overall length including the lead-in conductors. The present invention is based on this requirement, with the further demand as described and specified, as a problem.

Up to now it has been customary to manufacture the lead-in conductors of varactor diodes, and also the lead-in conductors of electrical components in general, such as of resistors, capactiors, tubes, etc., from wires or tapes of equal or uniform cross-section, already for reasons of the convenient and quick insertability into sockets, or similar holding arrangements.

With respect to tubes, however, already in the early stage of their development, types were known, having connecting or base pins of different thicknesses. These differently dimensioned diameters of the connecting pins, however, merely served to safeguard an unambiguous assignment of connecting pins to the plug-in holes of the associated socket.

With respect to semiconductor diodes of small power, however, it has hitherto always been customary to provide the two lead-in conductors with same cross-sections, because the distinction between the anode lead-in conductor and the cathode lead-in conductor is made by a standardized marking applied to the cathode-sided end of the diode casing. A uniform diameter of the lead-in conductors also safeguards that these conductors can be inserted into the bores of printed circuits with their predetermined raster dimensions and their predetermined borehole diameters, without causing any difficulties.

Especially varactor diodes, as diodes having a low dissipation, were always provided with two wire- or tape-shaped lead-in conductors of uniform cross-section, because there was seen no reason for deviating from the type of lead-in conductors as customary with semiconductor diodes.

In distinction thereto, and for solving the aforementioned problem, the present invention proposes a varactor diode which is provided with lead-in conductors which are axially lead out of the casing on opposite face sides and, in which the spread between units of the resonant frequency as determined by the junction capacitance and the lead-in inductance, as due to manufacture, is capable of being compensated subsequently.

As already mentioned, it is desirable in certain cases of practical application, for the varactor diodes to have a given total length including the lead-in conductors. This demand arises with respect to a favorable measuring ability when inserted in automatic measuring equipments, as well as with respect to the easy packing, but also with respect to certain other cases of practical application, so that this is not only demanded by the manufacturer of the varactor diodes, but also by the customer and user and the application engineer. It, therefore, is an object of the present invention to provide a method of manufacturing varactor diodes having the features of the invention, with all varactor diodes resulting from this method being supposed to have the same total or overall length.

This particular problem as arising in connection with the manufacture of such types of varactor diodes, is solved by the inventive method in that the varactor diode is at first provided with lead-in conductors which are longer than the given total or overall length, that the lead-in conductors are connected to the measuring contacts of a measuring equipment, which are arranged at a spaced relation corresponding to the given total or overall length, that the varactor diode is shifted between the measuring contacts in the axial direction until reaching the nominal or rated resonant frequency, and that thereupon the lead-in conductors are cut or at least marked at the points being in touch with the measuring contacts.

The insertion of the inventive types of varactor diodes into cavity resonators which are aimed at effecting the tuning of input circuits of television receivers, is considered to be of particular interest. For solving this problem, i.e. of inserting varactor diodes in cavity resonators, it has already been proposed to arrange a varactor diode in the course of an inner conductor of a cavity resonator, and to use the lead-in conductors of the varactor diode as the inner conductor of the cavity resonator. In this case the one lead-in conductor is connected to the casing of the cavity resonator. The other lead-in conductor is mostly insulated from the casing of the cavity resonator by a capacitor inserted therebetween. The DC voltage necessary for varying the junction capacitance of the diode is applied to the latter via both the casing of the cavity resonator and the insulated lead-in conductor. The adjusting of the resonant frequency is effected in accordance with this earlier proposal in that on the varactor diode lead-in conductor connected to the casing of the cavity resonator, a shorting link is arranged adjustably.

The inventive types of varactor diodes enable in some cases a more elegant and simple solution to this particular problem, namely in that the varactor diodes, either by the component manufacturer, are supplied by being already measured or adjusted to a predetermined or given resonant frequency, and are cut to the necessary length, or else in that they, by the manufacturer of the equipment, are displaced axially inside the cavity resonator until reaching the required resonant frequency. Thereupon the lead-in conductors are fixed in this position by way of soldering.

SUMMARY OF THE INVENTION

According to the broadest aspects of the invention this varactor diode has the lead-in conductors, at least outside the casing, and with respect to their geometrical shape which is determinative of their lead-in inductance are of different shape for a given total or overall length.

One type of embodiment of the invention consists in that each lead-in conductor consists of a cylindrical wire of constant diameter, that the one lead-in conductor, however, has a different diameter than the other lead-in conductor. A further embodiment of this type consists in that at least one of the wires is conically tapered towards the end of the lead-in conductor or towards the point at which the lead-in conductor emerges out of the casing.

Another type of embodiment of the invention is characterized by the fact that the lead-in conductors consist of a tape-shaped wire of rectangular cross-section, and that the one lead-in conductor has a different cross-section than the second lead-in conductor. In this case at least one of the tapes may be tapered in a pyramid or parallelepiped fashion, i.e. towards the end of the lead-in conductors or towards the point where the lead-in conductor emerges out of the casing.

A further embodiment of these types of embodiments of the invention results in a varactor diode in which the one lead-in conductor is designed cylindrically, while the other lead-in conductor is designed in a tape-shaped fashion. For the purpose of further increasing the lead-in inductance with respect to length, it is of particular advantage if the cylindrical or tape-shaped lead-in conductors do not extend in a stretched straightforward fashion, but have a sinewave triangular, trapezoidal, rectangular, or any other meander-shape. In the case of the tape-shaped lead-in conductor this may be accomplished in that either the cross-sectional width or the cross-sectional height is varied by the meander shape.

IN THE DRAWINGS

Figure 2:
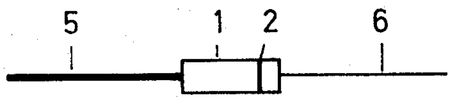
Figure 3:
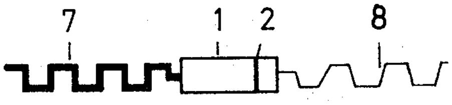
Figure 4:
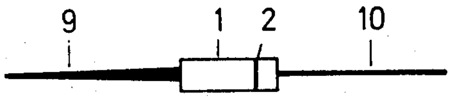
Figure 4:
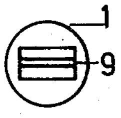
Figure 5:
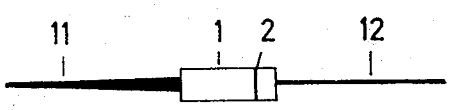
Figure 5:
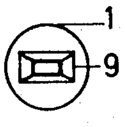
Figure 6:
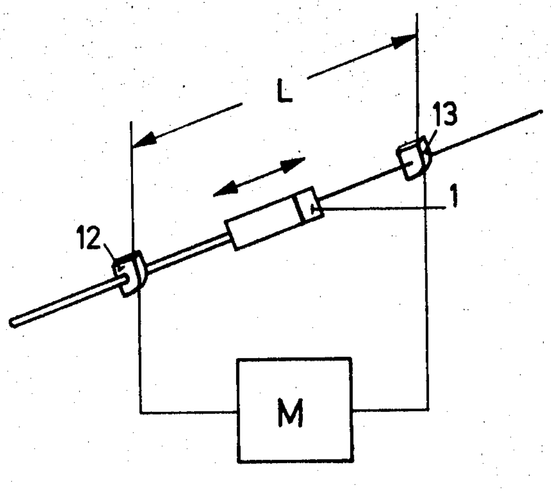
Figure 7:
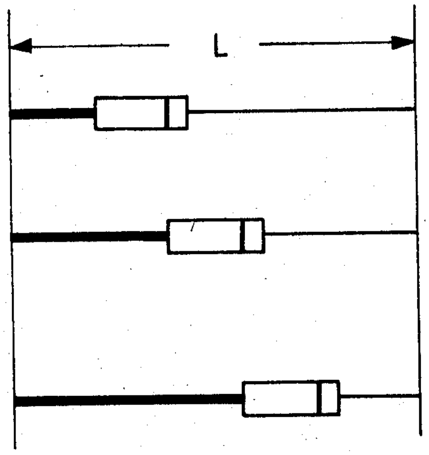
Figure 8:
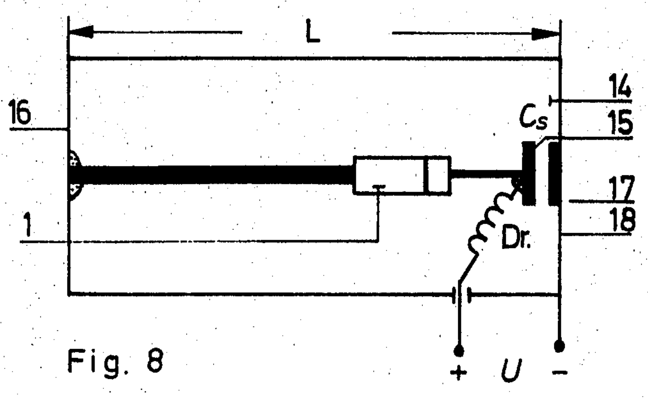
Figure 9:
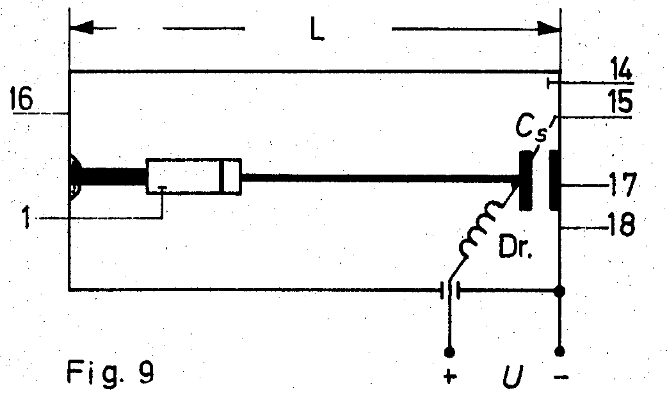
Figure 10:
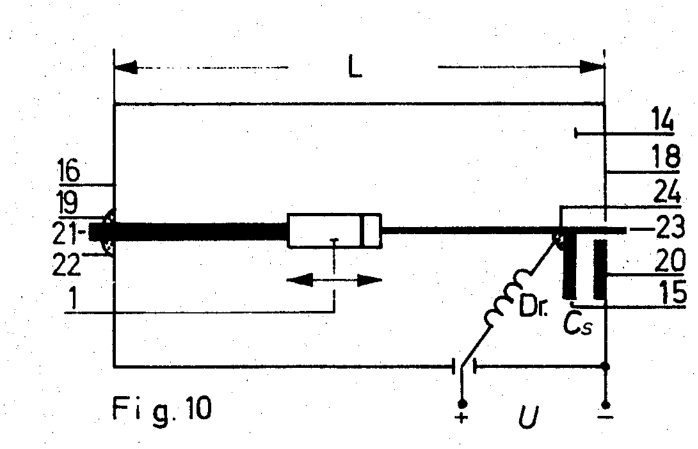

FIG. 1 shows a conventional type of varactor diode (bekannt=known),

FIG. 2 shows a type of embodiment of the varactor diode according to the invention, FIG. 3 shows a modified type of embodiment, FIG. 4 shows a further type of embodiment in a top and side view, FIG. 5 shows another type of embodiment in a top and side view, FIG. 6, on principle, shows a measuring arrangement of the type required for the manufacture of varactor diodes having a predetermined total or overall length, FIG. 7 shows three varactor diodes according to the invention, manufactured with the arrangement according to FIG. 6, FIG. 8 shows an inventive type of varactor diode as inserted in a cavity resonator, FIG. 9 shows another type of varactor diode as inserted in a cavity resonator, and FIG. 10 shows the insertion of an inventive type of varactor diode in a cavity resonator.

DETAILED DESCRIPTION

In referring now to FIG. 1 it will be seen that the varactor diode consists of the casing 1 in which the actual diode semiconductor element is held in position and connected to the lead-in conductors. The dash marking 2 indicates in the conventional manner the cathode side of the varactor diode. The lead-in conductors 3 and 4 of equal length, and consist of wires having the same cross-section.

In FIG. 2 there is shown a kind of embodiment of the inventive type of varactor diode in which the lead-in conductors 5 and 6 consist of a cylindrical wire, with the lead-in conductor 5 having a larger diameter than the lead-in conductor 6. On account of this the inductance with respect to length of the one lead-in conductor substantially deviates from that of the other lead-in conductor, so that the lead-in inductance between two connecting points arranged at a predetermined spaced relation, is dependent upon the length of each individual lead-in conductor.

In the type of embodiment according to FIG. 3 the two lead-in conductors 7 and 8 consist of tapes having a rectangular cross-section. The lead-in conductor 7 is deformed in the direction of the cross-sectional width of the tape in a rectangular meander-shaped fashion, whereas the lead-in conductor 8 is designed to have a trapezoidal meander shape in direction of the cross-sectional height. From this there will likewise result a different lead-in inductance with respect to length.

FIG. 4 shows a further embodiment of the type of varactor diode shown in FIG. 2. The one lead-in conductor 9 is designed in a parallelepiped fashion by the fact that in the outline according to FIG. 4*a*, the height of the tape is variable, as may also be taken from the side view shown on an enlarged scale in FIG. 4*b*. The other lead-in conductor 10 is of a constant cross-section.

Another further embodiment of the type of varactor diode according to FIG. 2 is shown in FIG. 5. The one lead-in conductor 11 is designed to have the shape of a truncated pyramid on account of the fact that the height as well as the width of the tape are variable along the lead-in conductor. From FIG. 5*a* there is merely to be taken the variation in height, whereas the variation in width may be taken from the side view as shown on an enlarged scale in FIG. 5*b*. The other lead-in conductor 12 is designed to have a rectangular shape of constant cross-section.

FIG. 6 schematically shows a measuring arrangement for determining the resonant frequency of a varactor diode. The measuring contacts 12 and 13 of suitable design are arranged at the spaced relation L. In the axial direction as indicated by the double arrow, the varactor diode to be measured is capable of being displaced between the measuring contacts. These measuring contacts are in communication with the measuring equipment M permitting to determine the resonant frequency of the varactor diode. The varactor diode is now shifted between the measuring contacts until the nominal or rated frequency is reached. Thereupon, and with the aid of a cutting device which is appropriately connected to the measuring contacts, the lead-in conductors are cut off in this position, or are provided with a marking.

FIG. 7 shows three such measured varactor diodes of the total or overall length L with the length of each lead-in conductor differing from the other so that in this way, by the different inductance of the varactor diodes the spreading of the junction capacitance with respect to the resonant frequency is compensated.

FIGS. 8 and 9 show two varactor diodes having a total or overall length L, as inserted in a cavity resonator 14. At the one end of the cavity resonator there is arranged the series capacitor $C_s$, between the one plate 15 thereof and the one wall of the casing 16, there is soldered the varactor diode 1 having a total or overall length L. The DC voltage V as required for the purpose of varying the junction capacitance of the varactor diode is applied via the reactance coil D*r* and the metal casing of the cavity resonator 14. The other plate of the capacitor $C_s$ is electrically connected to the wall of the casing 18 lying opposite the wall of the casing 16.

In the cavity resonator according to FIG. 8 the major part of the inner conductor is constituted by the thicker connecting wire of the diode, whereas in the cavity resonator according to FIG. 9 chiefly the thin connecting wire is effective.

Accordingly, therefore, with respect to equal circuit capacitances the resonant frequency of the cavity resonator according to FIG. 8 is lower than that of the cavity resonator according to FIG. 9.

In FIG. 10 it is shown how the cavity resonator 14 can be simultaneously used for balancing and for inserting a varactor diode according to the invention. On opposite walls of the casing 16 and 18 there is provided each time one lead-through hole or grommet 19 or 20, permitting to move a varactor diode according to the invention in the direction as indicated by the arrow, by simultaneously maintaining an electrical contact with the wall 16 of the casing on one hand, and the plate 15 of the capacitor $C_s$ on the other hand, backwards and forwards. After having obtained the optimum position of the varactor diode with respect to the operation of the cavity resonator and the given frequency, which corresponds to a balancing of the cavity resonator 14, the one lead-in conductor 21 is fixed to the wall 16 of the casing and the lead-through point 19 on the outside with the aid of the soldering metal 22. In the same way the other lead-in conductor 23 is fixed to the plate 15 of the capacitor $C_s$ with the aid of the soldering metal 24.

Accordingly, the inventive type of varactor diode offers the advantage over the conventional types of varactor diodes employing two lead-in conductors of geometrically the same design, that cavity resonators with given fixed dimensions can be balanced without requiring any further auxiliary means. Moreover, a technical progress achievable with the varactor diode according to the invention is to be seen in that it is possible for the first time, by varying the lengths of the lead-in conductors of the varactor diode, to vary the inductance of the varactor diode stronger than linearly.

It is to be understood that the foregoing description of specific examples of this invention is made by way of example only and is not to be considered as a limitation on its scope.

What is claimed is:

1. A varactor diode having a first and second lead-in conductor emerging on opposite face sides axially out of a casing, in which the spread between units of the resonant frequency are determined by the junction capacitance and the lead-in inductance, wherein the improvement comprises: said first and second lead-in conductors, at least outside the casing, are of a given total or overall length, and at least said first lead-in conductor is of rectangular cross-sectional shape, whereby the cross-sectional and longitudinal shape of said lead-in conductors determines the lead-in inductance.

2. A varactor diode according to claim 1, wherein said second lead-in conductor consists of a cylindrical wire.

3. A varactor diode according to claim 2, wherein said second lead-in conductor is conically tapered toward its end.

4. A varactor diode according to claim 2, wherein said second lead-in conductor is conically tapered toward the point where it emerges out of the casing.

5. A varactor diode according to claim 2 wherein said second lead-in conductor has a sinewave, triangular, trapezoidal, or rectangular meander shape.

6. A varactor diode according to claim 1, wherein at least one of said lead-in conductors is tapered in a pyramid or parallelepiped fashion toward the end or the point where it emerges out of the casing.

7. A varactor diode according to claim 1, wherein at least one of said lead-in conductors, in direction of the cross-sectional width or in direction of the cross-sectional height, has a sinewave, triangular, trapezoidal, or rectangular meander shape.

8. A varactor diode according to claim 1, wherein said second lead-in conductor consists of a cylindrical or conical wire, and said first lead-in conductor consists of a tape-shaped or pyramid- or parallelpipe-shaped wire respectively.

9. A varactor diode according to claim 1, wherein at least one of said lead-in conductors has a sinewave, triangular, trapezoidal, or rectangular meander longitudinal shape.

10. A varactor diode having a first and second lead-in conductor emerging on opposite face sides axially out of a casing, in which the spread between units of the resonant frequency are determined by the junction capacitance and the lead-in inductance, wherein the improvement comprises: said first and second lead-in conductors are of a given overall length at least outside the casing and at least said first lead-in conductor outside the casing has a circular cross-sectional shape and a sinewave, triangular, trapezoidal, or rectangular meander longitudinal geometrical shape.

11. A varactor diode according to claim 10 wherein said first lead-in conductor is longitudinally tapered.

References Cited

UNITED STATES PATENTS

| | | | |
|---|---|---|---|
| 3,189,799 | 6/1965 | Moroney | 317—234 |
| 3,238,424 | 3/1966 | Jenkinson | 317—234 |

JOHN W. HUCKERT, Primary Examiner

R. F. POLISSACK, Assistant Examiner

U.S. Cl. X.R.

317—235; 307—320; 329—160, 161